United States Patent
Bohn et al.

(10) Patent No.: US 10,025,355 B2
(45) Date of Patent: **\*Jul. 17, 2018**

(54) FLEXIBLE DISPLAY EXTENDABLE ASSEMBLY

(71) Applicant: Microsoft Technology Licensing, LLC, Redmond, WA (US)

(72) Inventors: David D. Bohn, Fort Collins, CO (US); Paul M. O'Brien, Sammamish, WA (US)

(73) Assignee: Microsoft Technology Licensing, LLC, Redmond, WA (US)

( \* ) Notice: Subject to any disclaimer, the term of this patent is extended or adjusted under 35 U.S.C. 154(b) by 0 days.

This patent is subject to a terminal disclaimer.

(21) Appl. No.: 15/010,134

(22) Filed: Jan. 29, 2016

(65) Prior Publication Data

US 2016/0147261 A1 May 26, 2016

Related U.S. Application Data

(63) Continuation of application No. 13/154,876, filed on Jun. 7, 2011, now Pat. No. 9,286,812.

(51) Int. Cl.
*G06F 1/16* (2006.01)
*H04M 1/02* (2006.01)
(Continued)

(52) U.S. Cl.
CPC .......... *G06F 1/1647* (2013.01); *G06F 1/1652* (2013.01); *G06F 1/1656* (2013.01);
(Continued)

(58) Field of Classification Search
None
See application file for complete search history.

(56) References Cited

U.S. PATENT DOCUMENTS 5,349,772 A 9/1994 Pardue
6,288,891 B1 9/2001 Hasegawa et al.
(Continued)

FOREIGN PATENT DOCUMENTS

CN 1989760 6/2007
EP 2187247 5/2010
(Continued)

OTHER PUBLICATIONS

"Corrected Notice of Allowance", U.S. Appl. No. 13/154,876, filed Feb. 19, 2016, 2 pages.
(Continued)

*Primary Examiner* — Binh Tran
*Assistant Examiner* — Douglas Burtner
(74) *Attorney, Agent, or Firm* — Rainier Patents, P.S.

(57) ABSTRACT

In embodiments of a flexible display extendable assembly, an extendable assembly includes a slideable display guide integrated in a first housing part of an extendable electronic device. The extendable electronic device includes a flexible display that slide-engages into the first housing part of the extendable electronic device. The extendable assembly includes an extendable mechanism that is coupled in a second housing part of the extendable electronic device and to the slideable display guide. The first and second housing parts of the extendable electronic device slide-engage relative to each other. The extendable mechanism is implemented to extend as the first and second housing parts slide apart relative to each other, and also to retract as the first and second housing parts slide together relative to each other.

20 Claims, 6 Drawing Sheets

(51) Int. Cl.
*G09F 9/30* (2006.01)
*G09F 9/35* (2006.01)
*H01L 51/52* (2006.01)
*H04B 1/3827* (2015.01)

(52) U.S. Cl.
CPC ............. *G09F 9/301* (2013.01); *G09F 9/35* (2013.01); *H01L 51/5237* (2013.01); *H04B 1/3833* (2013.01); *H04M 1/0268* (2013.01); *H01L 2251/5338* (2013.01); *Y10T 29/49002* (2015.01)

(56) References Cited

U.S. PATENT DOCUMENTS

| | | | |
|---|---|---|---|
| 6,532,147 B1 | 3/2003 | Christ, Jr. | |
| 6,643,124 B1 | 11/2003 | Wilk | |
| 6,762,929 B2 | 7/2004 | Sawyer | |
| 6,859,219 B1 | 2/2005 | Sall | |
| 6,931,265 B2 | 8/2005 | Reyes et al. | |
| 7,149,557 B2 | 12/2006 | Chadha | |
| 7,426,107 B2 * | 9/2008 | Yeh | G06F 1/1626 340/815.4 |
| 7,558,057 B1 * | 7/2009 | Naksen | G06F 1/1613 361/679.3 |
| 7,667,962 B2 * | 2/2010 | Mullen | G06F 1/1624 359/461 |
| 7,723,733 B2 * | 5/2010 | Daniels | B32B 17/10036 257/100 |
| 7,746,293 B2 | 6/2010 | Kobayashi | |
| 7,830,333 B2 | 11/2010 | Aoki | |
| 7,928,934 B2 | 4/2011 | Kane | |
| 7,965,258 B2 | 6/2011 | Aoki | |
| 8,170,631 B2 | 5/2012 | Aoki | |
| 8,194,399 B2 | 6/2012 | Ashcraft et al. | |
| 8,289,232 B2 | 10/2012 | Kobayashi | |
| 8,363,393 B2 | 1/2013 | Bemelmans | |
| 8,379,377 B2 | 2/2013 | Walters et al. | |
| 8,493,726 B2 * | 7/2013 | Visser | G06F 1/1601 361/679.05 |
| 8,711,566 B2 * | 4/2014 | O'Brien | G06F 1/1624 361/724 |
| 9,081,540 B1 * | 7/2015 | Cho | G06F 1/1601 |
| 9,107,287 B2 * | 8/2015 | Ryu | G06F 1/1616 |
| 9,195,272 B2 * | 11/2015 | O'Brien | G06F 1/1624 |
| 9,286,812 B2 | 3/2016 | Bohn et al. | |
| 2004/0196268 A1 | 10/2004 | Hsu et al. | |
| 2005/0146498 A1 | 7/2005 | Hemia et al. | |
| 2005/0253775 A1 | 11/2005 | Stewart | |
| 2006/0082518 A1 | 4/2006 | Ram | |
| 2006/0109250 A1 * | 5/2006 | Prichard | G06F 1/1624 345/168 |
| 2006/0166713 A1 * | 7/2006 | Yeh | G06F 1/1626 455/575.1 |
| 2006/0176243 A1 * | 8/2006 | Yeh | G06F 1/1624 345/30 |
| 2007/0069975 A1 | 3/2007 | Gettemy et al. | |
| 2007/0146243 A1 * | 6/2007 | Ou Yang | G06F 1/1601 345/76 |
| 2007/0211036 A1 * | 9/2007 | Perkins | G06F 1/1615 345/173 |
| 2008/0086925 A1 | 4/2008 | Yang | |
| 2008/0144265 A1 * | 6/2008 | Aoki | G06F 1/1601 361/679.04 |
| 2008/0151480 A1 | 6/2008 | Chung et al. | |
| 2008/0158795 A1 | 7/2008 | Aoki et al. | |
| 2008/0182109 A1 | 7/2008 | Hashimoto | |
| 2008/0204367 A1 | 8/2008 | Lafarre et al. | |
| 2008/0247126 A1 | 10/2008 | Otsuka et al. | |
| 2008/0318633 A1 | 12/2008 | Wong et al. | |
| 2009/0051830 A1 * | 2/2009 | Matsushita | G02F 1/133305 348/836 |
| 2009/0237872 A1 | 9/2009 | Bemelmans | |
| 2010/0164973 A1 | 7/2010 | Huitema et al. | |
| 2010/0174930 A1 | 7/2010 | Kim | |
| 2010/0182738 A1 | 7/2010 | Visser et al. | |
| 2010/0208417 A1 * | 8/2010 | Visser | G06F 1/1613 361/679.01 |
| 2010/0246113 A1 * | 9/2010 | Visser | G06F 1/1601 361/679.3 |
| 2010/0281441 A1 | 11/2010 | Eldon et al. | |
| 2010/0328223 A1 * | 12/2010 | Mockarram-Dorri | G06F 3/041 345/173 |
| 2011/0043479 A1 | 2/2011 | van Aerle et al. | |
| 2011/0176260 A1 * | 7/2011 | Walters | G06F 1/1641 361/679.01 |
| 2012/0002357 A1 | 1/2012 | Auld et al. | |
| 2012/0243207 A1 * | 9/2012 | Wang | G09F 9/30 362/97.1 |
| 2012/0314400 A1 | 12/2012 | Bohn et al. | |
| 2013/0044410 A1 | 2/2013 | Verschoor et al. | |
| 2013/0058063 A1 | 3/2013 | O'Brien | |
| 2014/0194165 A1 * | 7/2014 | Hwang | G06F 1/1677 455/566 |
| 2014/0211399 A1 * | 7/2014 | O'Brien | G06F 1/1624 361/679.26 |
| 2015/0009635 A1 * | 1/2015 | Kang | G09F 9/301 361/749 |
| 2015/0035812 A1 * | 2/2015 | Shin | G09G 3/3688 345/204 |
| 2015/0227248 A1 * | 8/2015 | Yamazaki | G06F 3/0412 345/173 |
| 2015/0361696 A1 * | 12/2015 | Tazbaz | H04M 1/022 361/679.27 |
| 2015/0370287 A1 * | 12/2015 | Ko | G06F 1/1626 361/749 |
| 2015/0378397 A1 * | 12/2015 | Park | G06F 1/1652 361/679.27 |
| 2016/0028042 A1 * | 1/2016 | Lee | G02F 1/133305 361/749 |
| 2016/0040764 A1 * | 2/2016 | Park | G09F 9/301 361/679.01 |
| 2016/0227645 A1 * | 8/2016 | Hampton | G06F 1/1601 |

FOREIGN PATENT DOCUMENTS

| | | |
|---|---|---|
| EP | 2360517 | 8/2011 |
| TW | 200627945 | 8/2006 |

OTHER PUBLICATIONS

"Corrected Notice of Allowance", U.S. Appl. No. 14/243,759, filed Jul. 24, 2015, 4 pages.
"European Search Report", EP Application No. 12827695.3, dated Jun. 11, 2014, 3 pages.
"Final Office Action", U.S. Appl. No. 13/154,876, filed Jun. 1, 2015, 10 pages.
"Final Office Action", U.S. Appl. No. 13/154,876, filed Jun. 24, 2014, 10 pages.
"Foreign Office Action", CN Application No. 201210319598.1, dated Jun. 4, 2015, 7 Pages.
"Foreign Office Action", CN Application No. 201210319598.1, dated Jun. 17, 2014, 12 pages.
"Foreign Office Action", CN Application No. 201210319598.1, dated Nov. 15, 2014, 7 pages.
"Foreign Office Action", CN Application No. 201210319598.1, dated Dec. 8, 2015, 7 Pages.
"Foreign Office Action", EP Application No. 12827695.3, dated Jul. 14, 2014, 6 Pages.
"Foreign Office Action", EP Application No. 12827695.3, dated Mar. 10, 2015, 6 Pages.
"Foreign Office Action", EP Application No. 12827695.3, Dec. 11, 2015, 5 Pages.
"International Search Report and Written Opinion", Application No. PCT/US2012/053254, Feb. 22, 2013, 8 pages.
"LG 3D Mobile Phone with Photovoltaic Cells and Expandable Touch Display", http://www.thedesignblog.com, retrieved from <http://design.fr/news/lg-3d-mobile-phone-with-photovoltaic-cells-and-expandable-touch-display/> on Apr. 27, 2011, Jun. 2, 2010, 7 pages.

(56) References Cited

OTHER PUBLICATIONS

"Nokias Mobile Phones N85 Vs N75 Vs N95 Screen Comparison AMOLED V LCD", retrieved from <http://www.oled-display.net/nokias-mobile-phones-n85-vs-n75-vs-n95-screen-comparison-amoled-vs-lcd> on Apr. 26, 2011, 4 pages.

"Non-Final Office Action", U.S. Appl. No. 13/224,839, filed Aug. 26, 2013, 9 pages.

"Non-Final Office Action", U.S. Appl. No. 13/154,876, dated Feb. 11, 2014, 6 pages.

"Non-Final Office Action", U.S. Appl. No. 13/154,876, dated Dec. 11, 2014, 9 pages.

"Non-Final Office Action", U.S. Appl. No. 14/243,759, dated Mar. 31, 2015, 8 pages.

"Notice of Allowance", U.S. Appl. No. 13/154,876, dated Oct. 19, 2015, 8 pages.

"Notice of Allowance", U.S. Appl. No. 13/224,839, dated Dec. 13, 2013, 7 pages.

"Notice of Allowance", U.S. Appl. No. 14/243,759, dated Jul. 14, 2015, 6 pages.

"Restriction Requirement", U.S. Appl. No. 13/154,876, Oct. 17, 2013, 7 pages.

"Samsung Captivate (TM)—Black", retrieved from <http://reviews.wireless.att.com/4773/sku4760319/samsung-samsung-captivate-tm-black-reviews/reviews.htm?page=18&sort=rating> on Apr. 26, 2011, 7 pages.

"Supplemental Notice of Allowance", U.S. Appl. No. 13/224,839, dated Mar. 20, 2014, 4 pages.

Linder,"Will Smartphones of the Future Eliminate the Need for Tablets?", Retrieved from: <http://liliputing.com/2010/08/will-smartphones-of-the-future-eliminate-the-need-for-tablets.html> on Feb. 21, 2011, Aug. 10, 2010, 9 pages.

Luttrell,"Flexible Display Concepts are Cooler with Android", Retrieved from: <http://www.tgdaily.com/mobility-brief/53944-flexible-display-concepts-are-cooler-with-android> on Feb. 21, 2011, Feb. 4, 2011, 4 pages.

\* cited by examiner

FLEXIBLE DISPLAY EXTENDABLE ASSEMBLY

RELATED APPLICATION

This application is a continuation of U.S. patent application Ser. No. 13/154,876, filed Jun. 7, 2011, entitled "Flexible Display Extendable Assembly," the entire disclosure of which is hereby incorporated by reference herein in its entirety.

BACKGROUND

Portable electronic devices, such as mobile phones, media players, and tablet computers are increasingly common. These types of devices typically include an integrated display device, and many include dual displays. For example, a mobile device can be hinged to open two display devices side-by-side to form one larger display. Users typically want the smallest possible devices to conveniently carry in a pocket or purse, but also want devices with larger display surfaces for easier viewing. Display manufacturers are beginning to develop flexible displays that may be used to provide a larger display surface than would be typically integrated in a smaller, portable electronic device. However, flexible displays are susceptible to damage from environmental factors and when folded, such as in a hinged mobile device that would typically integrate two display devices side-by-side to form the one larger display.

SUMMARY

This Summary introduces simplified concepts of a flexible display extendable assembly, and the concepts are further described below in the Detailed Description and/or shown in the Figures. This Summary should not be considered to describe essential features of the claimed subject matter, nor used to determine or limit the scope of the claimed subject matter.

A flexible display extendable assembly is described. In embodiments, the extendable assembly includes a slideable display guide integrated in a first housing part of an extendable electronic device. The extendable electronic device includes a flexible display that slide-engages into the first housing part of the extendable electronic device. The extendable assembly includes an extendable mechanism that is coupled in a second housing part of the extendable electronic device and to the slideable display guide. The first and second housing parts of the extendable electronic device slide-engage relative to each other. The extendable mechanism is implemented to extend as the first and second housing parts slide apart relative to each other, and also to retract as the first and second housing parts slide together relative to each other.

In other embodiments, a section of the flexible display extends from the first housing part of the extendable electronic device when the first and second housing parts slide apart relative to each other. The section of the flexible display also retracts into the first housing part of the extendable electronic device when the first and second housing parts slide together relative to each other. The extendable mechanism can include one or more extendable scissor mechanisms, or a rack-and-pinion mechanism, that extends in both of the first and second housing parts of the extendable electronic device when the first and second housing parts slide apart relative to each other. The extendable mechanism applies a force to the slideable display guide to extend the section of the flexible display from the first housing part of the extendable electronic device without tension applied to the flexible display. The extendable mechanism also applies a force to the second housing part that pulls the flexible display from the first housing part when the first and second housing parts of the extendable electronic device slide apart relative to each other.

BRIEF DESCRIPTION OF THE DRAWINGS

Embodiments of a flexible display extendable assembly are described with reference to the following Figures. The same numbers may be used throughout to reference like features and components that are shown in the Figures.

DETAILED DESCRIPTION

A flexible display extendable assembly is described, and embodiments can be implemented for use with a flexible display in a foldable and/or extendable electronic device. For example, a portable device, such as a mobile phone or tablet computer, may be implemented as a foldable and/or extendable electronic device that includes an integrated flexible display. A mobile phone with a flexible display can be used as a standard-size phone and then also extended or unfolded to increase the display viewing surface for a user to read emails, view a map, edit a document, and other tasks that are conveniently accomplished on a larger display.

While features and concepts of a flexible display extendable assembly can be implemented in any number of different devices, systems, and/or configurations, embodiments of a flexible display extendable assembly are described in the context of the following example devices, systems, and methods.

Figure 1:
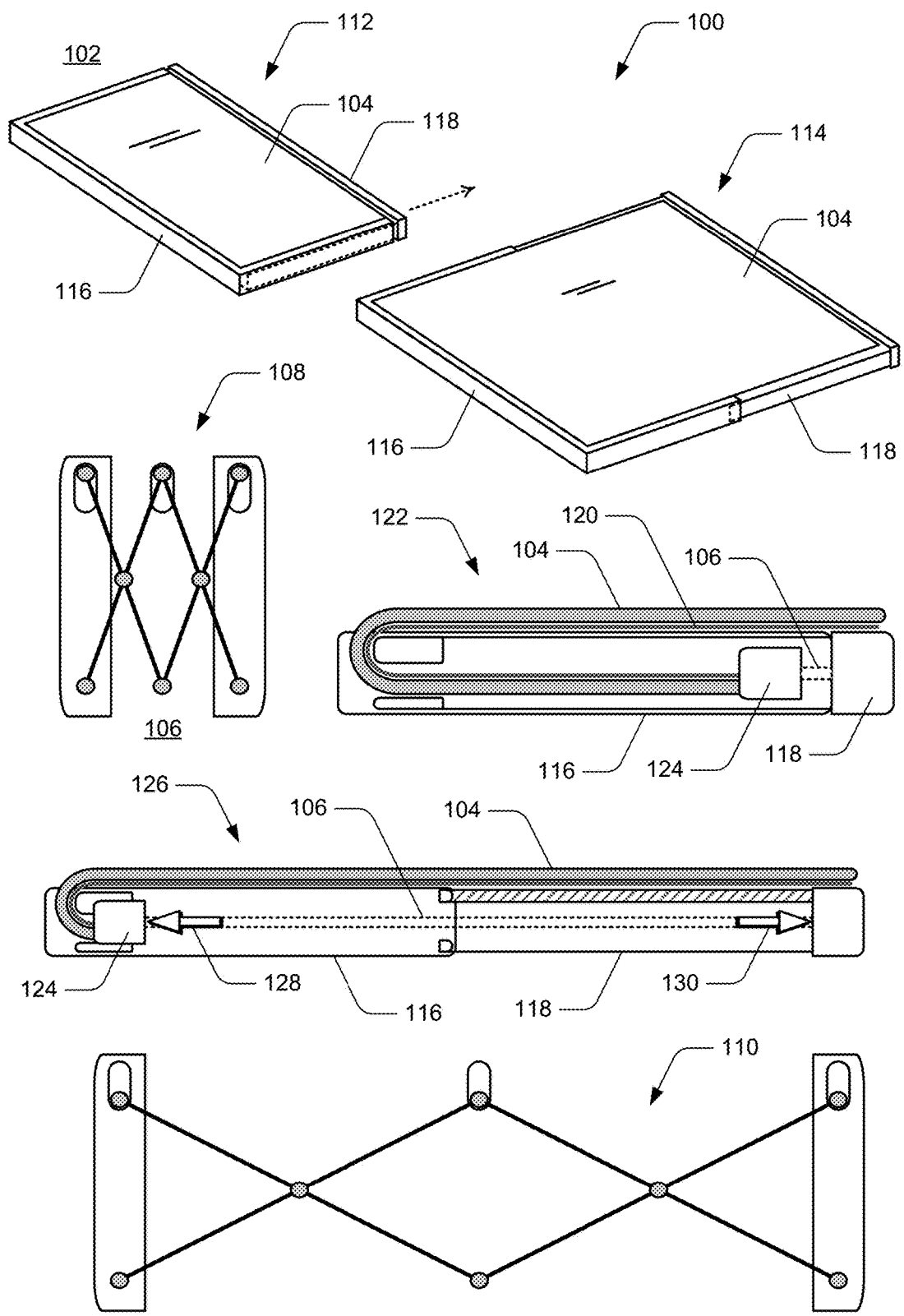
FIG. 1 illustrates examples of a flexible display extendable assembly in accordance with one or more embodiments.

FIG. 1 illustrates examples 100 of a flexible display extendable assembly in accordance with embodiments described herein. An extendable electronic device 102 includes a flexible display 104 and can be implemented with an extendable mechanism 106, shown retracted at 108 and extended at 110. The extendable electronic device is shown in a closed position at 112, and in an open position at 114. The device includes a first housing part 116 and a second housing part 118 that are operable to slide-engage relative to each other. In this example, the second housing part is implemented to slide-engage into the first housing part.

The flexible display 104 may be implemented as a flexible LCD display that is illuminated with a backlight. A flexible backlight 120 can be implemented to illuminate the flexible display, and the flexible backlight extends from and retracts into the first housing part of the extendable electronic device under the flexible display. Alternately, the flexible display may be implemented as a flexible OLED display that self-emits without the need for an integrated flexible backlight.

The extendable electronic device 102 is also shown in the closed position at 122, and the flexible display 104 extends from and retracts into the first housing part 116 of the extendable electronic device. The flexible display is connected to a slideable display guide 124 that is integrated in the first housing part of the device. The extendable electronic device 102 is also shown in the open position at 126, with the second housing part 118 slide-extended from the first housing part 116. The extendable mechanism 106 is coupled to the slideable display guide 124 and in the second housing part 118 of the extendable electronic device. The extendable mechanism is implemented to extend as the first and second housing parts slide apart relative to each other, as shown extended at 110. The extendable mechanism is also implemented to retract as the first and second housing parts slide together relative to each other, as shown at 108.

In embodiments, a section of the flexible display 104 is retractable to slide-engage into the first housing part 116 of the extendable electronic device 102 when the section of the flexible display is not activated for display, such as in the closed position of the device shown at 122. The section of the flexible display extends from the first housing part of the extendable electronic device when the first and second housing parts slide apart relative to each other as shown at 126 (i.e., in the open position of the device). The section of the flexible display also retracts into the first housing part of the extendable electronic device when the first and second housing parts slide together relative to each other as shown at 122 (i.e., in the closed position of the device).

In embodiments, the extendable mechanism 106 is implemented to apply a force 128 to the slideable display guide 124 to extend the flexible display from the first housing part 116 of the extendable electronic device 102 without tension applied to the flexible display. The extendable mechanism also applies an additional force 130 to the second housing part that pulls the flexible display from the first housing part when the first and second housing parts of the extendable electronic device slide apart relative to each other. In this example, the extendable mechanism is an extendable scissor mechanism that extends in both of the first and second housing parts of the extendable electronic device. In other embodiments, the extendable mechanism can be implemented as multiple extendable scissor mechanisms as described with reference to FIGS. 2 and 3, or as a rack-and-pinion mechanism that is described with reference to FIG. 4.

Figure 2:
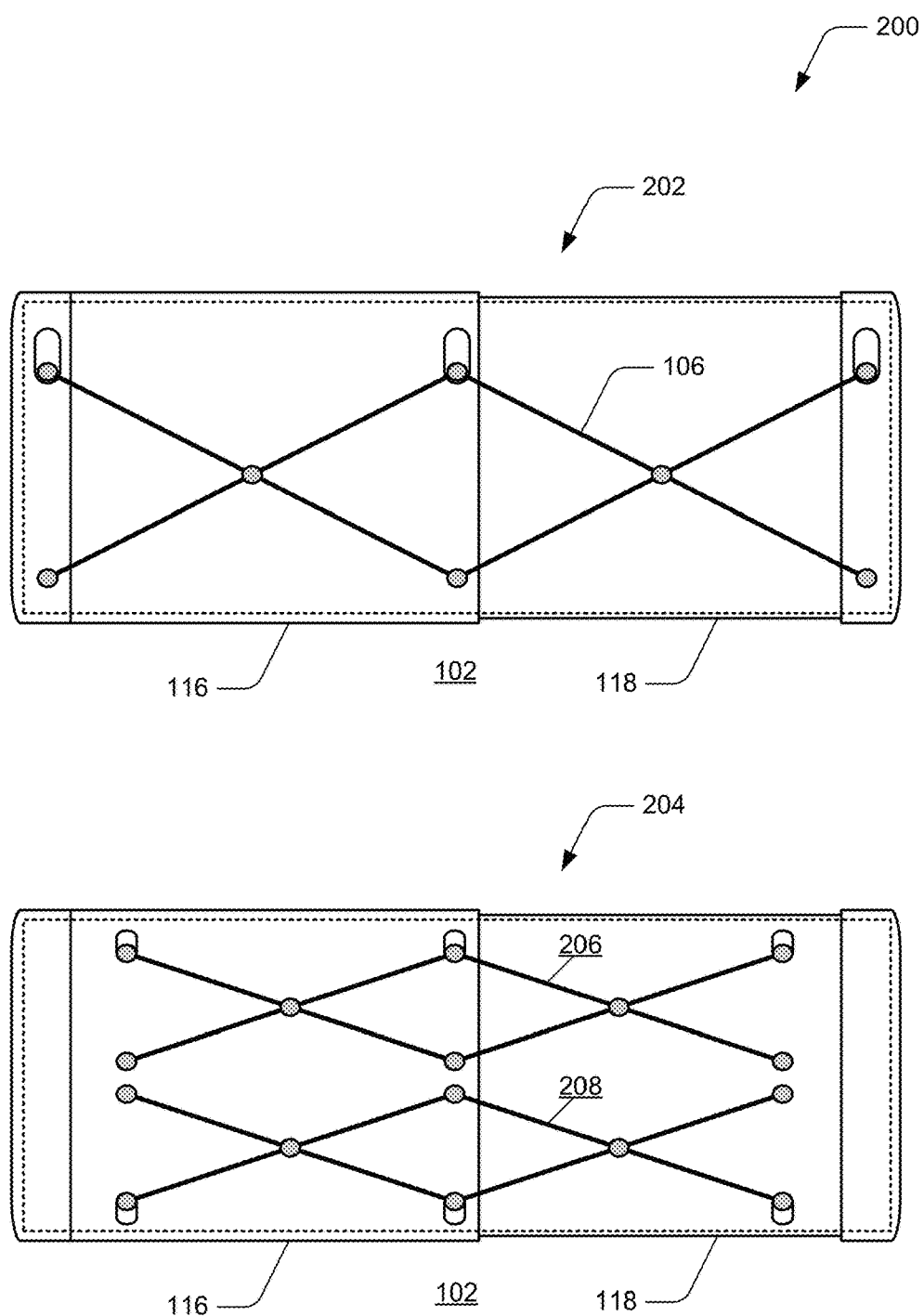
FIG. 2 further illustrates the examples of the flexible display extendable assembly described with reference to FIG. 1 in accordance with one or more embodiments.

FIG. 2 further illustrates examples 200 of the flexible display extendable assembly implemented in the extendable electronic device 102 described with reference to FIG. 1. In a first configuration at 202, the extendable electronic device includes a single extendable mechanism, such as the extendable mechanism 106. In a second configuration at 204, the extendable electronic device includes multiple extendable mechanisms 206 and 208 that are implemented to extend as the first housing part 116 and the second housing part 118 slide apart relative to each other, and retract as the first and second housing parts of the device slide together relative to each other. In other embodiments, the extendable electronic device can be implemented with multiple extendable scissor mechanisms as described with reference to FIG. 3, or with a rack-and-pinion mechanism as described with reference to FIG. 4.

Figure 3:
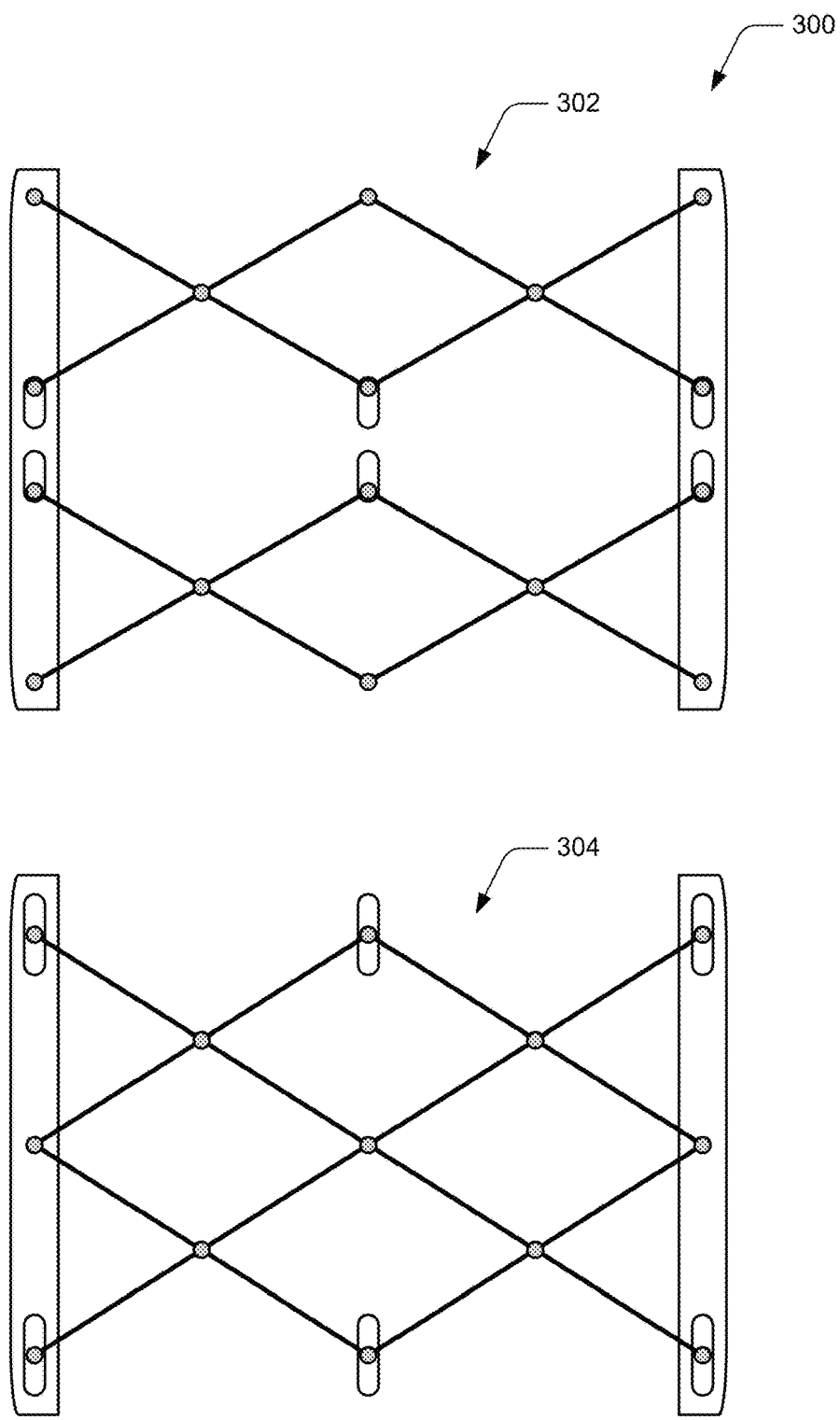
FIG. 3 further illustrates examples of the flexible display extendable assembly in accordance with one or more embodiments.

FIG. 3 further illustrates examples 300 of a flexible display extendable assembly, such as may be implemented in the extendable electronic device 102 shown in FIG. 1. In a first configuration, an extendable mechanism 302 includes multiple extendable scissor mechanisms that extend as the first and second housing parts of an extendable electronic device slide apart relative to each other, and retract as the first and second housing parts of the device slide together relative to each other. In a second configuration, an extendable mechanism 304 includes integrated extendable scissor mechanisms that extend as the first and second housing parts of an extendable electronic device slide apart relative to each other, and retract as the first and second housing parts of the device slide together relative to each other.

Figure 4:
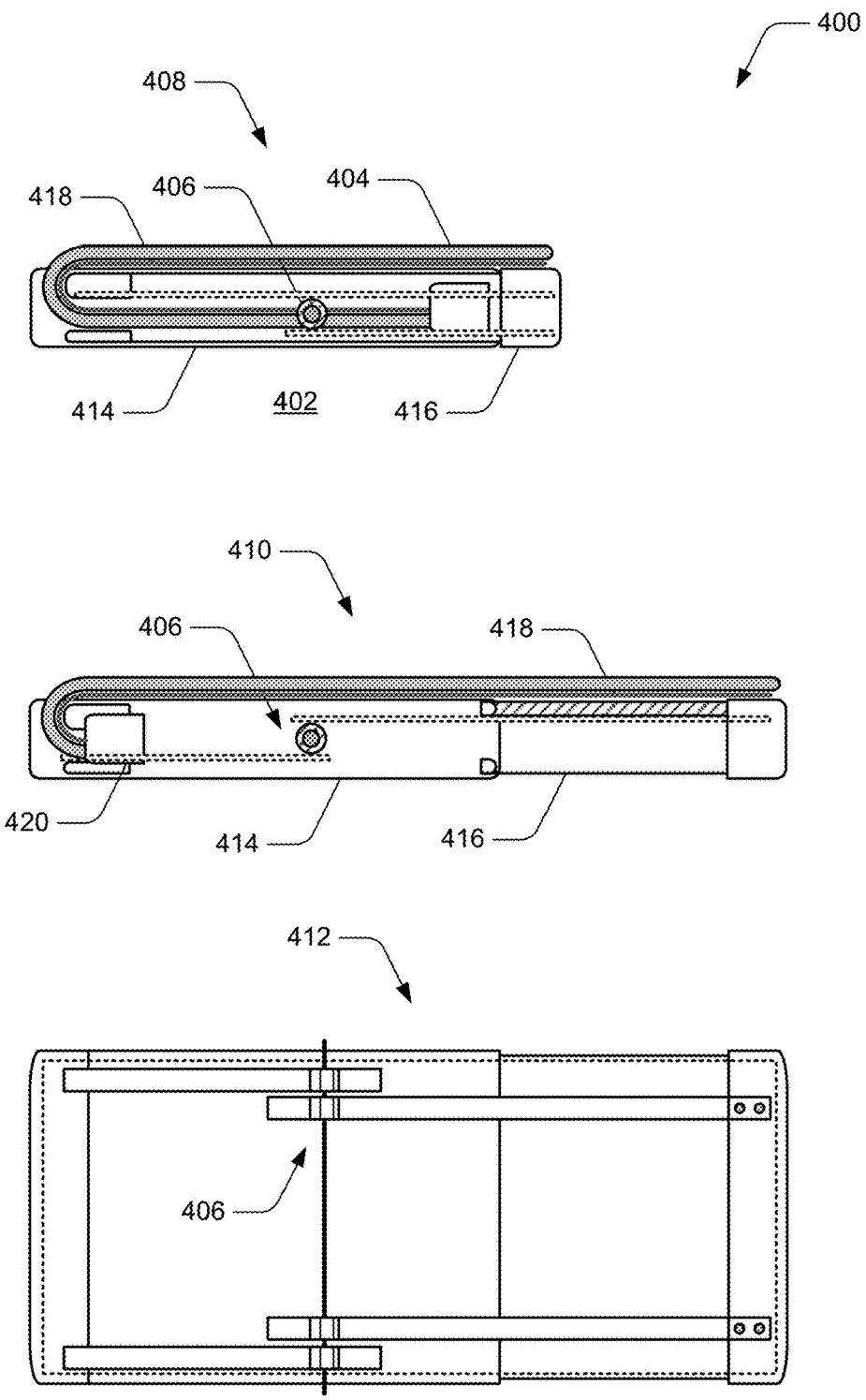
FIG. 4 illustrates examples of a flexible display extendable assembly in accordance with one or more embodiments.

FIG. 4 illustrates examples 400 of a flexible display extendable assembly, such as may be implemented in the extendable electronic device 102 shown in FIG. 1. In this example, an extendable electronic device 402 includes a flexible display 404 and an extendable rack-and-pinion mechanism 406, shown retracted in a closed position of the extendable electronic device at 408 and shown extended in an open position of the device at 410. The extendable rack-and-pinion mechanism 406 is also shown from a top view at 412.

The extendable electronic device 402 includes a first housing part 414 and a second housing part 416 that are operable to slide-engage relative to each other. In this example, the second housing part is implemented to slide-engage into the first housing part. The extendable rack-and-pinion mechanism 406 extends as the first and second housing parts of the extendable electronic device slide apart relative to each other, and retracts as the first and second housing parts of the device slide together relative to each other.

The flexible display 404 extends from and retracts into the first housing part 414 of the extendable electronic device. The flexible display 404 may be implemented as a flexible LCD display that is illuminated with a backlight. A flexible backlight 418 can be implemented to illuminate the flexible display, and the flexible backlight extends from and retracts into the first housing part of the extendable electronic device under the flexible display. Alternately, the flexible display may be implemented as a flexible OLED display that self-emits without the need for an integrated flexible backlight.

Figure 5:
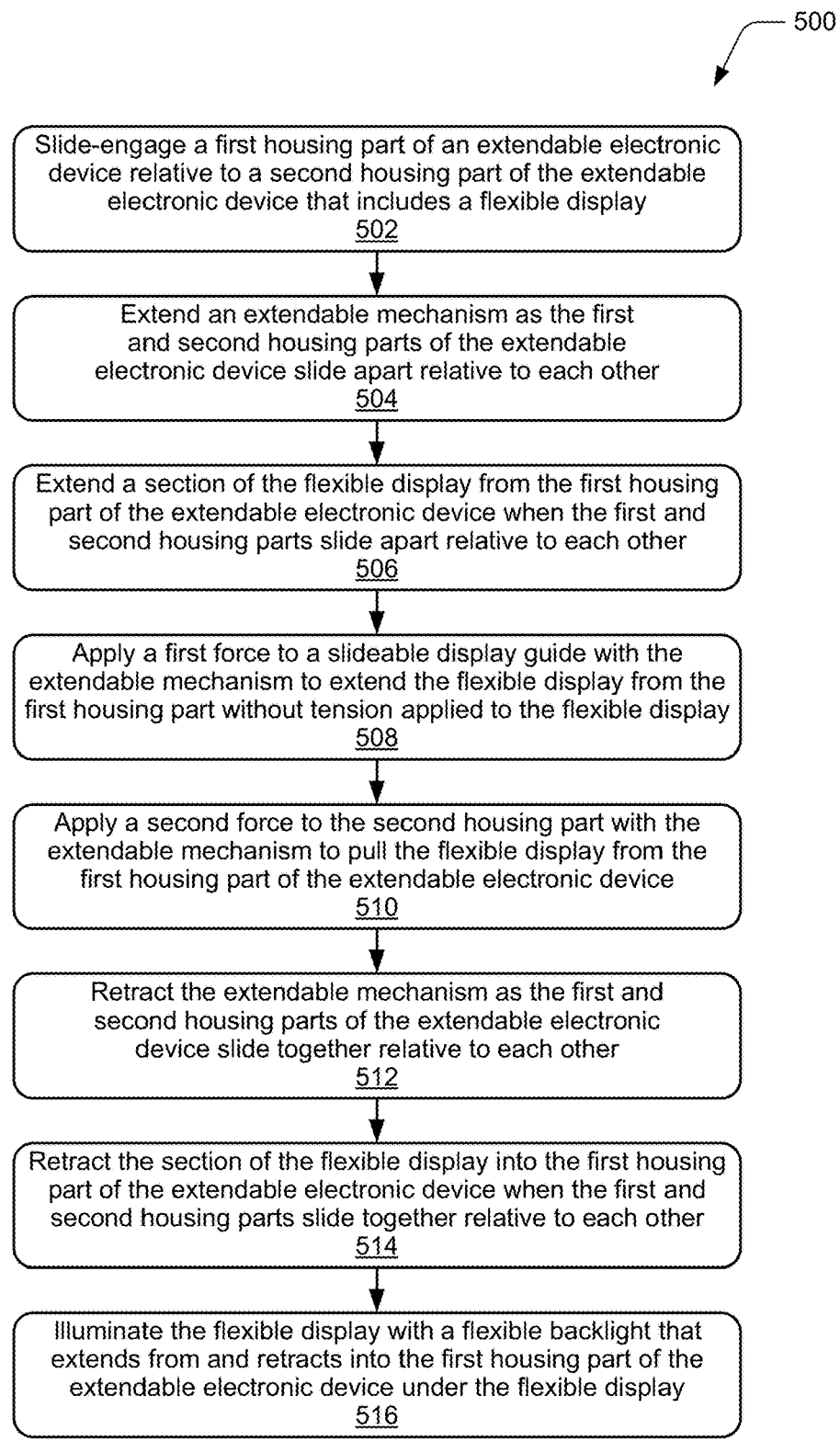
FIG. 5 illustrates example method(s) of a flexible display extendable assembly in accordance with one or more embodiments.

FIG. 5 illustrates example method(s) 500 of a flexible display extendable assembly. The order in which the method blocks are described are not intended to be construed as a limitation, and any number of the described method blocks can be combined in any order to implement a method, or an alternate method.

At block 502, a first housing part of an extendable electronic device is slide-engaged relative to a second housing part of the extendable electronic device that includes a flexible display. For example, the extendable electronic device 102 (FIG. 1) includes the first housing part 116 and the second housing part 118 that slide-engage relative to each other. The extendable electronic device also includes the flexible display 104 that may be implemented as a flexible LCD display, or as a flexible OLED display.

At block 504, an extendable mechanism is extended as the first and second housing parts of the extendable electronic device slide apart relative to each other. For example, the extendable electronic device 102 includes the extendable mechanism 106, which extends as the first and second housing parts of the device slide apart relative to each other, as shown extended at 110.

At block 506, a section of the flexible display extends from the first housing part of the extendable electronic device when the first and second housing parts slide apart relative to each other. For example, the section of the flexible display 104 extends from the first housing part 116 of the extendable electronic device 102 when the first and second housing parts slide apart relative to each other as shown at 126 (i.e., in the open position of the device).

At block 508, a first force is applied to a slideable display guide with the extendable mechanism to extend the flexible display from the first housing part without tension applied to the flexible display. For example, the extendable mechanism 106 applies the force 128 to the slideable display guide 124 to extend the flexible display 104 from the first housing part 116 of the extendable electronic device 102 without tension applied to the flexible display.

At block 510, a second force is applied to the second housing part with the extendable mechanism to pull the flexible display from the first housing part of the extendable electronic device. For example, the extendable mechanism 106 also applies the additional force 130 to the second housing part 118 that pulls the flexible display 104 from the first housing part 116 when the first and second housing parts of the extendable electronic device 102 slide apart relative to each other.

At block 512, the extendable mechanism is retracted as the first and second housing parts of the extendable electronic device slide together relative to each other. For example, the extendable mechanism 106 retracts as the first and second housing parts of the extendable electronic device 102 slide together relative to each other, as shown at 108.

At block 514, the section of the flexible display is retracted into the first housing part of the extendable electronic device when the first and second housing parts slide together relative to each other. For example, a section of the flexible display 104 is retractable to slide-engage into the first housing part 116 of the extendable electronic device 102 when the section of the flexible display is not activated for display, such as in the closed position of the device shown at 122. The section of the flexible display retracts into the first housing part of the extendable electronic device when the first and second housing parts slide together relative to each other as shown at 122 (i.e., in the closed position of the device).

At block 516, the flexible display is illuminated with a flexible backlight that extends from and retracts into the first housing part of the extendable electronic device under the flexible display. For example, the flexible backlight 120 illuminates the flexible display 104, such as a flexible LCD display, and the flexible backlight extends from and retracts into the first housing part of the extendable electronic device under the flexible display.

Figure 6:
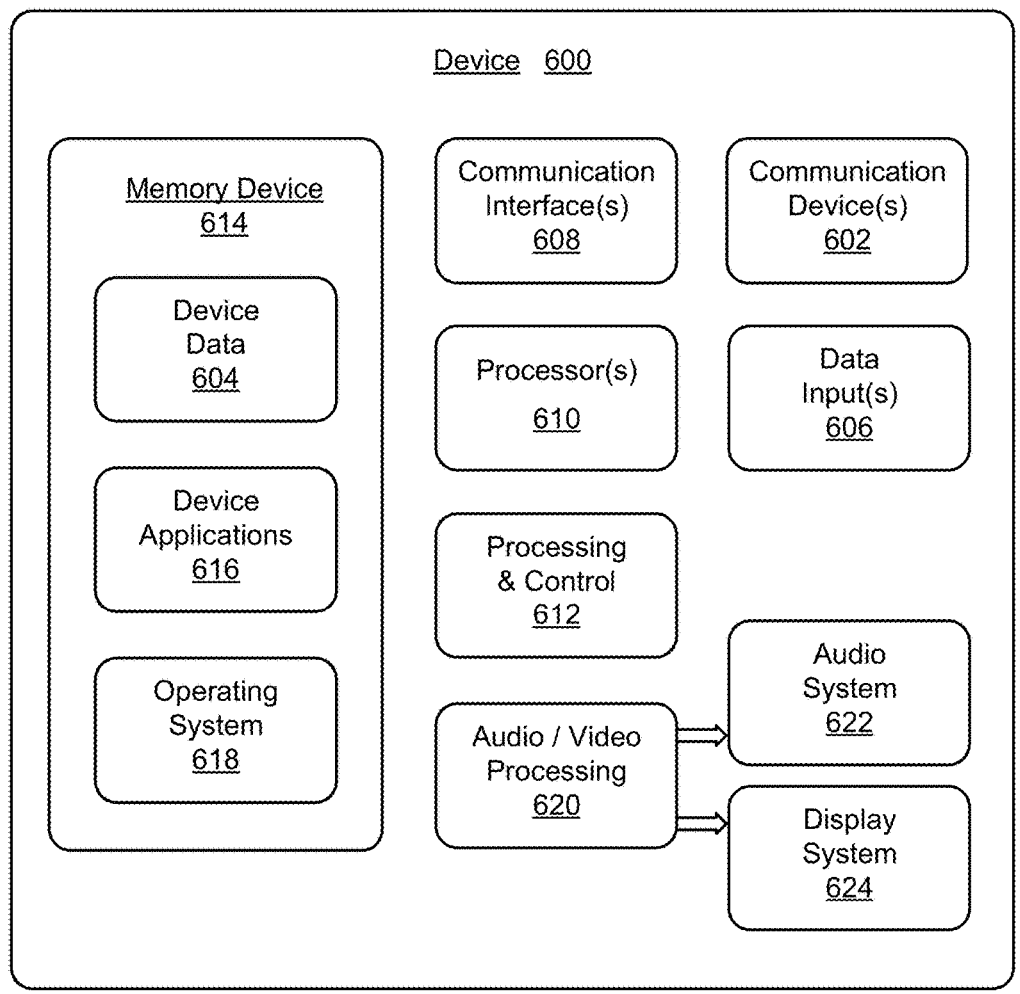
FIG. 6 illustrates various components of an example electronic device in which embodiments of a flexible display extendable assembly can be implemented.

FIG. 6 illustrates various components of an example device 600 that can be implemented as any of the extendable electronic devices described with reference to the previous FIGS. 1-5. In embodiments, the device may be implemented as any one or combination of a fixed or mobile device, in any form of a consumer, computer, portable, user, communication, phone, navigation, television, appliance, gaming, media playback, and/or electronic device. The device may also be associated with a user (i.e., a person) and/or an entity that operates the device such that a device describes logical devices that include users, software, firmware, hardware, and/or a combination of devices.

The device 600 includes communication devices 602 that enable wired and/or wireless communication of device data 604, such as received data, data that is being received, data scheduled for broadcast, data packets of the data, etc. The device data or other device content can include configuration settings of the device, media content stored on the device, and/or information associated with a user of the device. Media content stored on the device can include any type of audio, video, and/or image data. The device includes one or more data inputs 606 via which any type of data, media content, and/or inputs can be received, such as user-selectable inputs and any other type of audio, video, and/or image data received from any content and/or data source.

The device 600 also includes communication interfaces 608, such as any one or more of a serial, parallel, network, or wireless interface. The communication interfaces provide a connection and/or communication links between the device and a communication network by which other electronic, computing, and communication devices communicate data with the device.

The device 600 includes one or more processors 610 (e.g., any of microprocessors, controllers, and the like) which process various computer-executable instructions to control the operation of the device. Alternatively or in addition, the device can be implemented with any one or combination of software, hardware, firmware, or fixed logic circuitry that is implemented in connection with processing and control circuits which are generally identified at 612. Although not shown, the device can include a system bus or data transfer system that couples the various components within the device. A system bus can include any one or combination of different bus structures, such as a memory bus or memory controller, a peripheral bus, a universal serial bus, and/or a processor or local bus that utilizes any of a variety of bus architectures.

The device 600 also includes one or more memory devices 614 (e.g., computer-readable storage media) that enable data storage, such as random access memory (RAM), non-volatile memory (e.g., read-only memory (ROM), flash memory, etc.), and a disk storage device. A disk storage device may be implemented as any type of magnetic or optical storage device, such as a hard disk drive, a recordable and/or rewriteable disc, and the like. The device may also include a mass storage media device.

Computer readable media can be any available medium or media that is accessed by a computing device. By way of example, and not limitation, computer readable media may comprise storage media and communication media. Storage media include volatile and non-volatile, removable and non-removable media implemented in any method or technology for storage of information, such as computer-readable instructions, data structures, program modules, or other data. Storage media include, but are not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store information and which can be accessed by a computer.

Communication media typically embody computer-readable instructions, data structures, program modules, or other data in a modulated data signal, such as carrier wave or other transport mechanism. Communication media also include any information delivery media. A modulated data signal has one or more of its characteristics set or changed in such a manner as to encode information in the signal. By way of example, and not limitation, communication media include wired media such as a wired network or direct-wired connection, and wireless media such as acoustic, RF, infrared, and other wireless media.

A memory device 614 provides data storage mechanisms to store the device data 604, other types of information and/or data, and various device applications 616. For example, an operating system 618 can be maintained as a software application with the memory device and executed on the processors. The device applications may also include a device manager, such as any form of a control application, software application, signal processing and control module, code that is native to a particular device, a hardware abstraction layer for a particular device, and so on.

The device 600 also includes an audio and/or video processing system 620 that generates audio data for an audio system 622 and/or generates display data for a display system 624, such as an integrated flexible display. The audio system and/or the display system may include any devices that process, display, and/or otherwise render audio, video, display, and/or image data. Display data and audio signals can be communicated to an audio device and/or to a display device via an RF (radio frequency) link, S-video link, composite video link, component video link, DVI (digital video interface), analog audio connection, or other similar communication link. In implementations, the audio system and/or the display system are integrated components of the example device. Alternatively, the audio system and/or display system are external components to the device.

Although embodiments of a flexible display extendable assembly have been described in language specific to features and/or methods, the subject of the appended claims is not necessarily limited to the specific features or methods described. Rather, the specific features and methods are disclosed as example implementations of a flexible display extendable assembly.

The invention claimed is:

1. An extendable assembly, comprising:
a slideable display guide integrated in a first housing part of an extendable electronic device that includes a flexible display;
an extendable mechanism coupled to a second housing part of the extendable electronic device and coupled to the slideable display guide, the second housing part of the extendable electronic device configured to slide-engage into the first housing part, the extendable mechanism configured to:
extend as the first and second housing parts slide apart relative to each other, the extendable mechanism applying a force to the slideable display guide to extend the flexible display from the first housing part without tension being applied to the flexible display and the extendible mechanism applying an opposite force to the second housing part that pulls the flexible display from the first housing part without the tension being applied to the flexible display; and
retract as the first and second housing parts slide together relative to each other, a first section of the flexible display configured to retract into the first housing part, the first section of the flexible display being flat and parallel to a second section of the flexible display when the first and second housing parts slide together relative to each other into a closed position.

2. The extendable assembly as recited in claim 1, wherein the extendable mechanism comprises a rack-and-pinion mechanism configured to extend in both of the first and second housing parts of the extendable electronic device when the first and second housing parts slide apart relative to each other.

3. An extendable assembly as recited in claim 1, wherein the first section of the flexible display extends from the first housing part of the extendable electronic device when the first and second housing parts slide apart relative to each other.

4. An extendable assembly as recited in claim 1, wherein the first section of the flexible display is retractable to slide-engage into the first housing part of the extendable electronic device when the first section of the flexible display is not activated for display.

5. An extendable assembly as recited in claim 1, wherein the extendible electronic device further comprises a flexible backlight configured to illuminate the flexible display, the flexible backlight further configured to extend from and retract into the first housing part of the extendable electronic device under the flexible display.

6. An extendable assembly as recited in claim 1, wherein the flexible display is an organic light-emitting diode (OLED) flexible display.

7. An extendable assembly as recited in claim 1, wherein the extendable electronic device is one of: a mobile phone, a tablet computer, or a gaming device.

8. An extendable electronic device, comprising:
a flexible display configured to extend from and retract into a first housing part of the extendable electronic device, the flexible display connected to a slideable display guide integrated in the first housing part of the extendable electronic device; and
an extendable mechanism coupled to a second housing part of the extendable electronic device and coupled to the slideable display guide, the second housing part configured to slide-engage into and out of the first housing part, the extendable mechanism configured to:
extend as the first and second housing parts slide apart relative to each other, the extendible mechanism applying a force to the slideable display guide to extend the flexible display from the first housing part without tension being applied to the flexible display and the extendible mechanism applying an opposite force to the second housing part that pulls the flexible display from the first housing part without the tension being applied to the flexible display; and
retract as the first and second housing parts slide together relative to each other, a first section of the flexible display configured to retract into the first housing part, the first section of the flexible display being flat and parallel to a second section of the flexible display when the first and second housing parts slide together relative to each other into a closed position of the extendable electronic device.

9. An extendable electronic device as recited in claim 8, wherein the extendable mechanism comprises a rack-and-pinion mechanism configured to extend in both of the first and second housing parts of the extendable electronic device when the first and second housing parts slide apart relative to each other.

10. An extendable electronic device as recited in claim 8, wherein the first section of the flexible display is retractable to slide-engage into the first housing part of the extendable electronic device when the flexible display is not activated for display.

11. An extendable electronic device as recited in claim 8, wherein the first section of the flexible display extends from the first housing part of the extendable electronic device when the first and second housing parts slide apart relative to each other.

12. An extendable electronic device as recited in claim 8, further comprising a flexible backlight configured to illuminate the flexible display, the flexible backlight further configured to extend from and retract into the first housing part of the extendable electronic device under the flexible display.

13. An extendable electronic device as recited in claim 8, wherein the flexible display is an organic light-emitting diode (OLED) flexible display.

14. An extendable electronic device as recited in claim 8, wherein the extendable electronic device is one of: a mobile phone, a tablet computer, or a gaming device.

15. A mobile communication device comprising:
a wireless communication interface;
a processor and memory system coupled to the wireless communication interface and to a flexible display that is configured to extend from and retract into a first housing part of the mobile communication device, the flexible display connected to a slideable display guide integrated in the first housing part of the mobile communication device; and
an extendable mechanism coupled to a second housing part of the mobile communication device and coupled to the slideable display guide, the second housing part configured to slide-engage into and out of the first housing part, the extendable mechanism configured to retract as the first and second housing parts slide together relative to each other, the extendible mechanism applying a force to the slideable display guide to retract the flexible display into the first housing part without tension being applied to the flexible display and the extendible mechanism applying an opposite force to the second housing part that pulls the flexible display into the first housing part without the tension being applied to the flexible display, the first section of the flexible display being flat and parallel to a second section of the flexible display when the first and second housing parts slide together relative to each other into a closed position of the mobile communication device.

16. A mobile communication device as recited in claim 15, wherein the extendable mechanism comprises a rack-and-pinion mechanism configured to extend in both of the first and second housing parts of the mobile communication device when the first and second housing parts slide apart relative to each other.

17. A mobile communication device as recited in claim 15, wherein the first section of the flexible display is retractable to slide-engage into the first housing part of the mobile communication device when the flexible display is not activated for display.

18. A mobile communication device as recited in claim 15, wherein the first section of the flexible display extends from the first housing part of the mobile communication device when the first and second housing parts slide apart relative to each other.

19. A mobile communication device as recited in claim 15, further comprising a flexible backlight configured to illuminate the flexible display, the flexible backlight further configured to extend from and retract into the first housing part of the mobile communication device under the flexible display.

20. A mobile communication device as recited in claim 15, wherein the flexible display is an organic light-emitting diode (OLED) flexible display.

\* \* \* \* \*